United States Patent
Kwon et al.

(10) Patent No.: US 11,637,165 B2
(45) Date of Patent: Apr. 25, 2023

(54) OLED PIXEL WITH APERTURE PROPORTIONAL TO CAPACITANCE

(71) Applicant: LG Display Co., Ltd., Seoul (KR)

(72) Inventors: Kyeong-Seob Kwon, Jeollabuk-do (KR); Do-Heon Kim, Busan (KR)

(73) Assignee: LG DISPLAY CO., LTD., Seoul (KR)

( * ) Notice: Subject to any disclaimer, the term of this patent is extended or adjusted under 35 U.S.C. 154(b) by 120 days.

(21) Appl. No.: 17/136,453

(22) Filed: Dec. 29, 2020

(65) Prior Publication Data

US 2021/0202642 A1   Jul. 1, 2021

(30) Foreign Application Priority Data

Dec. 30, 2019   (KR) .......................... 10-2019-0178349

(51) Int. Cl.
  *H01L 27/32*    (2006.01)
(52) U.S. Cl.
  CPC ...... *H01L 27/3265* (2013.01); *H01L 27/3216* (2013.01); *H01L 27/3246* (2013.01)
(58) Field of Classification Search
  CPC ............. H01L 27/3216; H01L 27/3246; H01L 27/3265
  See application file for complete search history.

(56) References Cited

U.S. PATENT DOCUMENTS

| 5,923,310 A | 7/1999 | Kim |
| 6,693,044 B1 * | 2/2004 | Yamazaki ......... H01L 21/02532 257/E21.414 |
| 2007/0132899 A1 | 6/2007 | Cheng et al. |
| 2009/0115933 A1 * | 5/2009 | Mimura ............ G02F 1/133512 349/59 |
| 2010/0214195 A1 * | 8/2010 | Ogasawara ....... G02F 1/136286 345/55 |
| 2017/0278906 A1 * | 9/2017 | Song ................... H01L 27/3216 |
| 2019/0198581 A1 * | 6/2019 | Kim ................... H01L 51/0096 |

FOREIGN PATENT DOCUMENTS

| CN | 106652912 A * | 5/2017 | .......... G09G 3/3233 |
| EP | 2006831 A1 * | 12/2008 | .......... G09G 3/3233 |
| KR | 10-2016-0081793 A | 7/2016 | |
| KR | 10-2018-0002430 A | 1/2018 | |
| KR | 10-2019-0128801 A | 11/2019 | |

OTHER PUBLICATIONS

United Kingdom Combined Search and Examination Report dated Jun. 9, 2021 issued in corresponding Patent Application No. GB2020506.8 (5 pages).
Combined Search and Examination Report dated Jul. 11, 2022 issued in counterpart United Kingdom Patent Application No. 2205723.6 (3 pgs).

* cited by examiner

*Primary Examiner* — Peter Bradford
(74) *Attorney, Agent, or Firm* — Polsinelli PC

(57) ABSTRACT

A display device includes a substrate having an active area and a non-active area; a plurality of first subpixels arranged in the active area; and a plurality of second subpixels arranged adjacent to a boundary area between the active area and the non-active area, wherein the first and second subpixels have storage capacitors that have different capacitance values from each other, so that visibility of the stepped shape generated in the boundary area can be eliminated.

18 Claims, 11 Drawing Sheets

OLED PIXEL WITH APERTURE PROPORTIONAL TO CAPACITANCE

CROSS-REFERENCE TO RELATED APPLICATION

This application claims the benefit of Korean Patent Application No. 10-2019-0178349, filed on Dec. 30, 2019, which is hereby incorporated by reference in its entirety.

BACKGROUND

Field of the Disclosure

The present disclosure relates to a display device, and more particularly, to a display device which may eliminate visibility of a stepped shape.

Discussion of the Background

With the advancement of the information-oriented society, various demands for display devices which display images have been increased. For example, flat panel display (FPD) devices having a small thickness and a low weight and achieving a large area are rapidly being developed as a substitute for conventional cathode ray tubes (CRTs), which have a large volume. As examples of these flat panel display (FPD) devices, a liquid crystal display (LCD), a plasma display panel (PDP), an organic light emitting diode (OLED) display, an electrophoretic display (ED), etc. are have been developed and are currently in use.

However, development of the conventional flat panel display (FPD) devices was focused on implementation of large screens, a display panel configured to display data has a rectangular shape, and thus, it is inappropriate to apply the conventional flat panel display (FPD) devices to the case in which it is necessary to form a specific shape.

For example, it is inappropriate to use the conventional rectangular flat panel display devices as display devices requiring various shapes, such as circular, oval and oblique linear shapes, i.e., a wall-mounted clock, a wristwatch and an instrument panel for vehicles, and thus, in order to satisfy such consumer demand, deformed display devices having a circular, oval and trapezoidal shapes are being developed.

However, the deformed display devices have a drawback in that an abnormal stepped shape is clearly visible in a boundary area between a display area and a bezel area.

SUMMARY

Accordingly, the present disclosure is directed to a display device that substantially obviates one or more problems due to limitations and disadvantages of the related art.

The present disclosure is also to provide a display device which can eliminate visibility of a stepped shape.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, a display device includes a substrate having an active area having a non-rectangular shape and a non-active area, a plurality of first subpixels arranged in the active area, and a plurality of second subpixels arranged adjacent to a boundary area between the active area and the non-active area, wherein a capacitance value of storage capacitors included in first subpixels arranged in the active area and a capacitance value of storage capacitors included in second subpixels arranged in a boundary area between the active area and the non-active area are set to be different.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Reference will now be made in detail to the exemplary aspects of the present disclosure, examples of which are illustrated in the accompanying drawings. However, the present disclosure may be embodied in many alternative forms and should not be construed as limited to the aspects set forth herein, and the aspects of the present disclosure are provided only to completely disclose the disclosure and to completely inform those skilled in the art of the scope of the disclosure.

Figure 1:
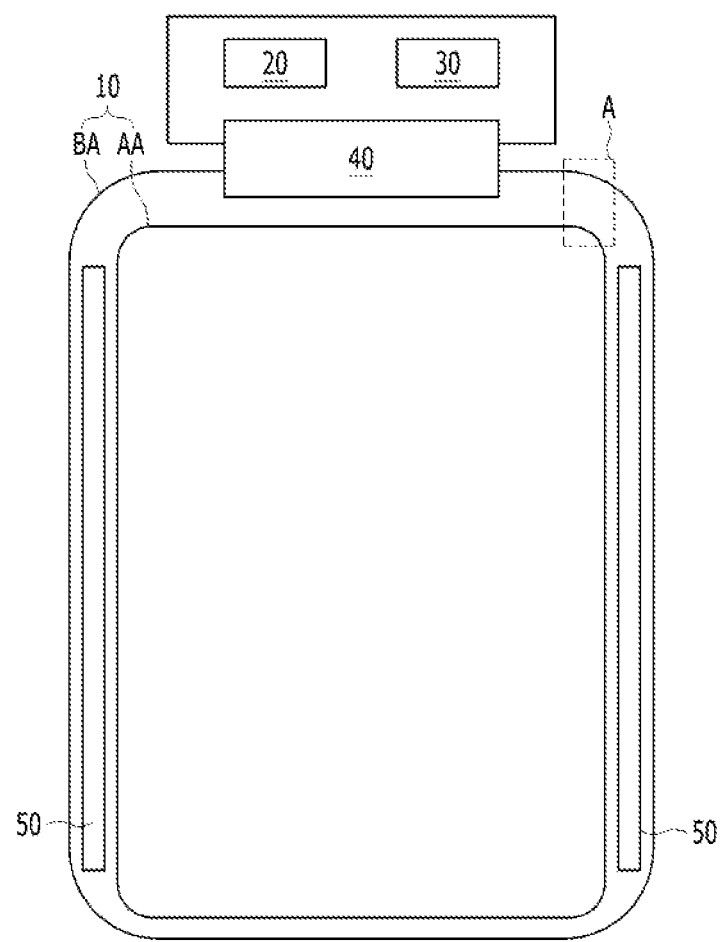
FIG. 1 is a block diagram illustrating a display device according to the present disclosure.

FIG. 1 is a block diagram illustrating an organic light emitting diode display device according to the present disclosure.

The organic light emitting diode display device shown in FIG. 1 includes a display panel 10, and a panel driving unit which drives the display panel 10. The panel driving unit includes a data driver 40, gate drivers 50, a power supply 30 and a timing controller 20.

The timing controller 20 generates data control signals and gate control signals to respectively control the driving timing of the data driver 40 and the gate drivers 50, and supplies the generated data control signals and gate control signals to the data driver 40 and the gate drivers 50. The timing controller 20 processes image data and supplies the processed image data to the data driver 40.

The power supply 30 generates power which is to be supplied to the display panel 10, the data driver 40 and the gate drivers 50.

The data driver 40 is controlled by a data control signal supplied from the timing controller 20, converts image data supplied from the timing controller 20 into an analog data signal, and supplies the analog data signal to the display panel 10.

The gate drivers 50 may be implemented as gate-in-panel (GIP) circuits which are directly formed in a bezel area BA of the display panel 10. The gate drivers 50 output gate signals to gate lines under the control of the timing controller 20. The gate drivers 50 shift the gate signals using a shift register and then sequentially supply the shifted gate signals to the gate lines.

The display panel 10 includes an active area AA, and the bezel area BA arranged in at least one side of the active area AA.

A screen on which an input image is displayed is implemented in the active area AA. If the active area AA is applied to a deformed display device having an arbitrary shape, the active area AA is formed in shapes other than a rectangle. For example, at least one side of the active area AA is formed in an oblique line or a curved line.

Figure 2:
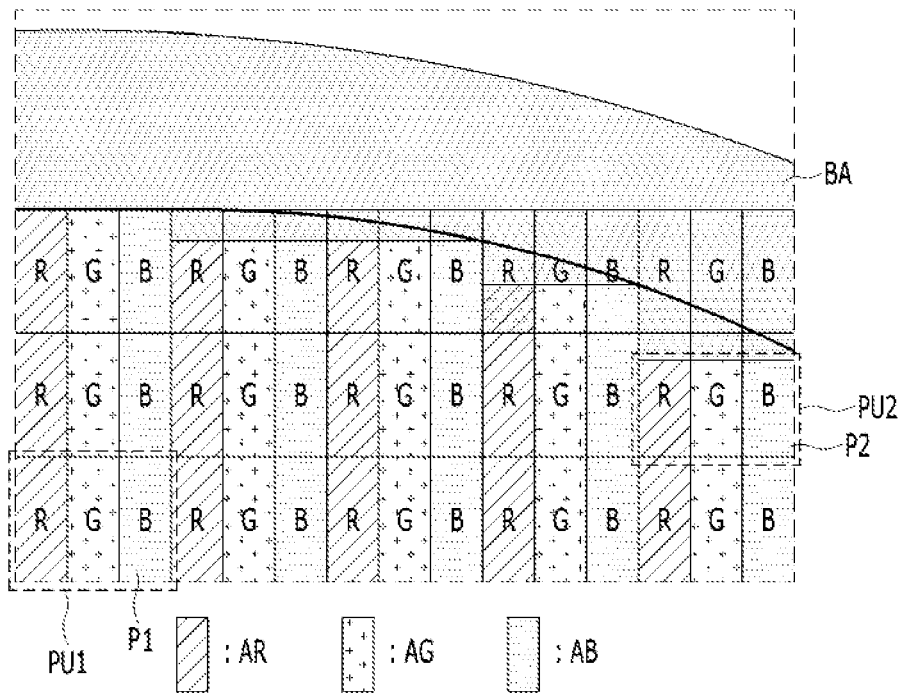
FIG. 2 is an enlarged view of portion "A" of FIG. 1.

A plurality of first unit pixels PU1 and a plurality of second unit pixels PU2 are arranged in the active area AA, as shown in FIG. 2. Each of the first and second unit pixels PU1 and PU2 may include red, green and blue subpixels R, G and B, or further include white subpixels, so as to implement colors.

Figure 3:
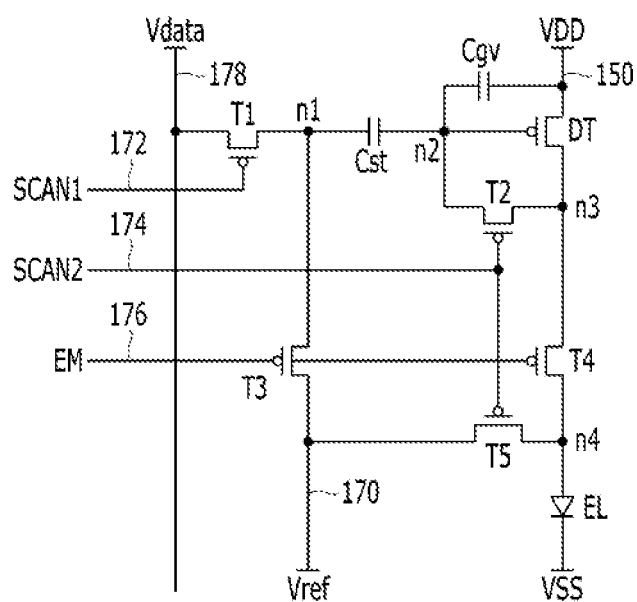
FIG. 3 is a circuit diagram illustrating a subpixel arranged in a display panel displayed in FIG. 1.

Each subpixel P1 or P2 has a light emitting diode EL and a pixel driving circuit to drive the light emitting diode EL, as shown in FIG. 3. The pixel driving circuit includes first to fifth switch TFTs T1, T2, T3, T4 and T5, a driving TFT DT, a storage capacitor Cst and an auxiliary capacitor Cgv. Here, the pixel driving circuit is not limited to the structure of FIG. 3, and may be variously changed.

The light emitting diode EL includes an anode connected to the fourth and fifth switch TFTs T4 and T5 through a fourth node n4, a cathode connected to a low voltage (VSS) terminal, and an organic compound layer formed between the anode and the cathode. The anodes of the respective subpixels are independently formed, and the cathode is formed to be shared by all of the subpixels. The organic compound layer may include a hole injection layer (HIL), a hole transport layer (HTL), an emission layer (EML), an electron transport layer (ETL) and an electron injection layer (EIL), but is not limited thereto. The light emitting diode EL emits light using current, the amount of which is adjusted by the driving TFT DT depending on data voltage Vdata.

The storage capacitor Cst connects a first node n1 and a second node n2. The storage capacitor Cst is charged with data voltage Vdata which is compensated to reach threshold voltage Vth of the driving TFT DT. Since the data voltage Vdata is compensated to reach the threshold voltage Vth of the driving TFT DT, characteristic deviation of the driving TFTs DTs between the subpixels may be compensated.

The auxiliary capacitor Cgv connects a high voltage (VDD) line 150 and the second node n2. The auxiliary capacitor Cgv prevents voltage of a gate electrode of the driving TFT DT from being changed due to undesired coupling.

The first to fifth switch TFTs T1, T2, T3, T4 and T5 and the driving TFT DT may employ an amorphous TFT, a polycrystalline TFT, an oxide TFT, an organic TFT or the like depending on the material of an active layer.

The first switch TFT T1 is controlled by a first scan signal SCAN1 of a first gate line 172, and supplies data voltage Vdata of a data line 178 to the first node n1 for a sampling period after an initialization period. The second switch TFT T2 is controlled by a second scan signal SCAN2 of a second gate line 174, and connects the second node n2 and the third node n3 for the sampling period, thereby connecting the driving TFT DT to the light emitting diode EL. The third switch TFT T3 is controlled by an emission control signal EM of a third gate line 176, and initializes the first node n1 and the storage capacitor Cst with reference voltage Vref through a reference voltage line 170 for the initialization period. The fourth switch TFT T4 is controlled by the emission control signal EM of the third gate line 176, and supplies driving current supplied from the driving TFT DT to the light emitting diode EL for an emission period after the sampling period. The fifth switch TFT T5 is controlled by the second scan signal SCAN2 of the second gate line 174, and initializes the fourth node n4 with the reference voltage Vref for the sampling period. The driving TFT DT adjusts current flowing in the light emitting diode EL depending on voltage Vgs between a gate electrode and a source electrode, stored in the storage capacitor Cst.

As described above, each subpixel P1 or P2 is driven differently depending on the initialization period, the sampling period and the emission period.

During the initialization period, the second and fifth switch TFTs T2 and T5 are turned on in response to the second scan signal SCAN2 of the second gate line 174. Simultaneously, the third and fourth switch TFTs T3 and T4 are turned on in response to the emission control signal EM of the third gate line 176. Thereby, the voltages of the respective nodes n1, n2, n3 and n4 and the voltage of the capacitor Cst are initialized to the reference voltage Vref.

During the sampling period, the first, second and fifth switch TFTs T1, T2 and T5 are turned on in response to the first and second scan signals SCAN1 and SCAN2 of the first and second gate lines 172 and 174. Here, the voltage Vgs between the gate electrode and the source electrode of the driving TFT DT, applied to the second node n2, is raised to the threshold voltage Vth of the driving TFT DT, and the data voltage Vdata is applied to the first node n1. Therefore, the capacitor Cst stores a difference between the data voltage Vdata and the threshold Vth of the driving TFT DT. Consequently, the data voltage Vdata is compensated to reach the threshold voltage Vth of the driving TFT DT. Therefore, the first to fifth switch TFTs T1, T2, T3, T4 and T5 are turned off in response to the first and second scan signals SCAN1 and SCAN2 and the emission control signal EM of the first to third gate lines 172, 174 and 176, and thus, the respective nodes n1 to n4 float.

During the emission period, the third and fourth switch TFTs T3 and T4 are turned on in response to the emission control signal EM of the third gate line 176, and thus, current flows into the light emitting diode EL and the light emitting diode EL emits light.

Figure 4:
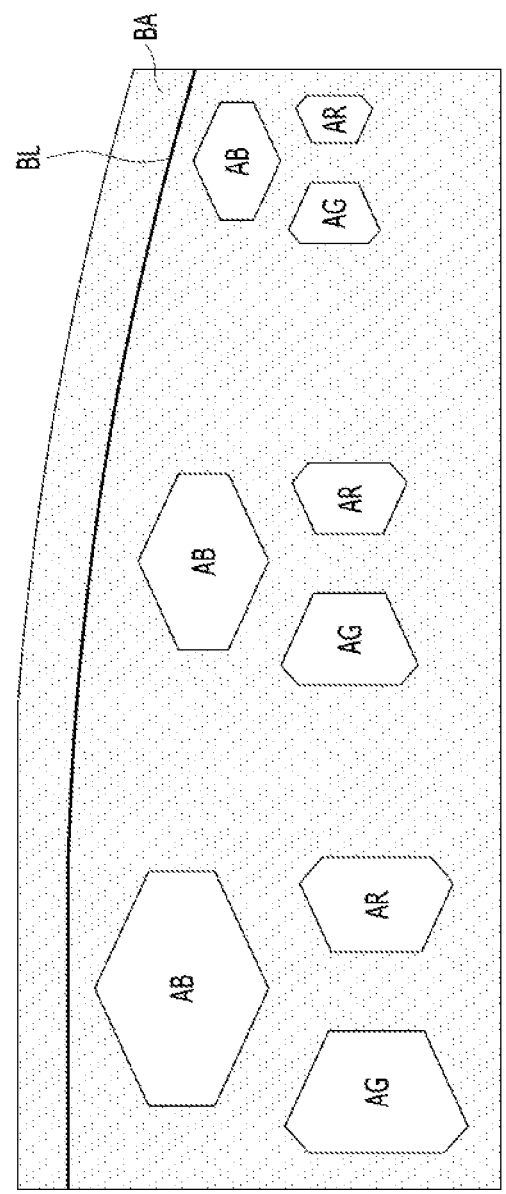
FIG. 4 is a view illustrating subpixels having non-rectangular emission areas arranged in the display panel shown in FIG. 1.
Figure 5:
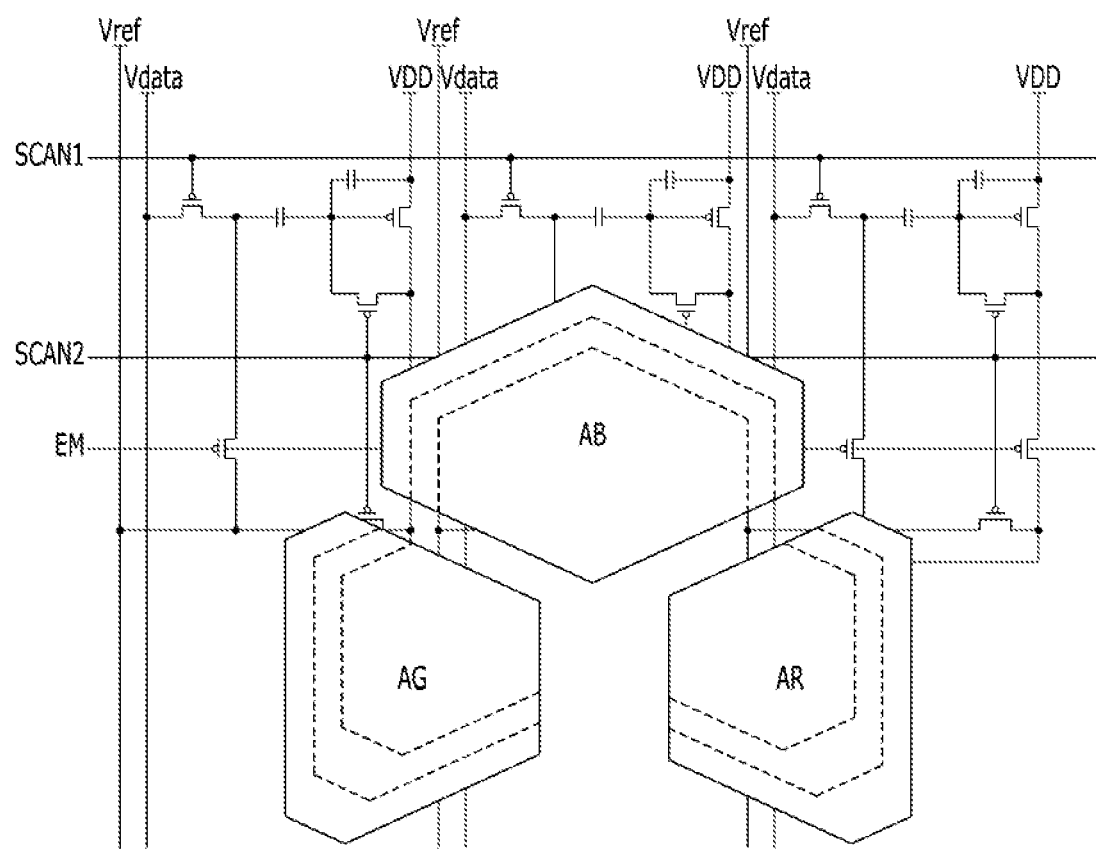
FIG. 5 is a view illustrating the non-rectangular emission areas and pixel driving circuits arranged in the display panel shown in FIG. 1.

The bezel area BA is arranged on at least one side of the active area AA in which the subpixels P1 and P2 are arranged. The second unit pixels PU2 are arranged in a boundary area (also referred to as a boundary line or a dead zone) BL between the bezel area and the active area. The second unit pixels PU2, which pass through the boundary area BL or are arranged close to the boundary area BL, are formed such that, as the second unit pixels PU2 are closer to the oblique or curved boundary area BL, the emission areas AR, AG and AB of the subpixels of the second unit pixels PU2 are gradually decreased. For example, when it is assumed that the emission area of the first subpixels P1 included in the first unit pixels PU1 is 100%, the emission area of the second subpixels P2 included in the second unit pixels PU2 may be gradually decreased to 75%, 50%, etc., as the second unit pixels PU2 are closer to the boundary area BL. Here, the emission areas AR, AG and AB of the respective subpixels P1 and P2 may have a rectangular shape, as shown in FIG. 2, or have a polygonal, circular or oval shape rather than the rectangular shape, as shown in FIGS. 4 and 5.

Therefore, the aperture ratio of each of the second subpixels P2 included in the second unit pixels PU2 is smaller than the aperture ratio of each of the first subpixels P1 included in the first unit pixels PU1. Here, the aperture ratio means a ratio of the area of the anode exposed by a bank (i.e., the emission area) to the overall area of each subpixel P1 or P2. That is, in the present disclosure, the overall areas of the first and second subpixels P1 and P2 are the same, but the emission areas AR, AG and AB of the second subpixels P2 are smaller than the emission areas AR, Ag and AB of the first subpixels P1.

However, since, as the emission area (or the aperture ratio) is decreased, the density of current flowing in the light emitting diode EL is increased, the second subpixels P2 having a small emission area (or a small aperture ratio) implement high luminance, and the first subpixels P1 having a large emission area (or a large aperture ratio) implement low luminance. Therefore, there is luminance deviation between the first subpixels P1 having the large emission area and the second subpixels P2 having the small emission area.

Accordingly, in the present disclosure, in order to prevent luminance deviation between the first and second subpixels P1 and P2, the capacitance value of at least one of the storage capacitor Cst or the auxiliary capacitor Cgv is set to be proportional to the aperture ratio.

Figure 6:
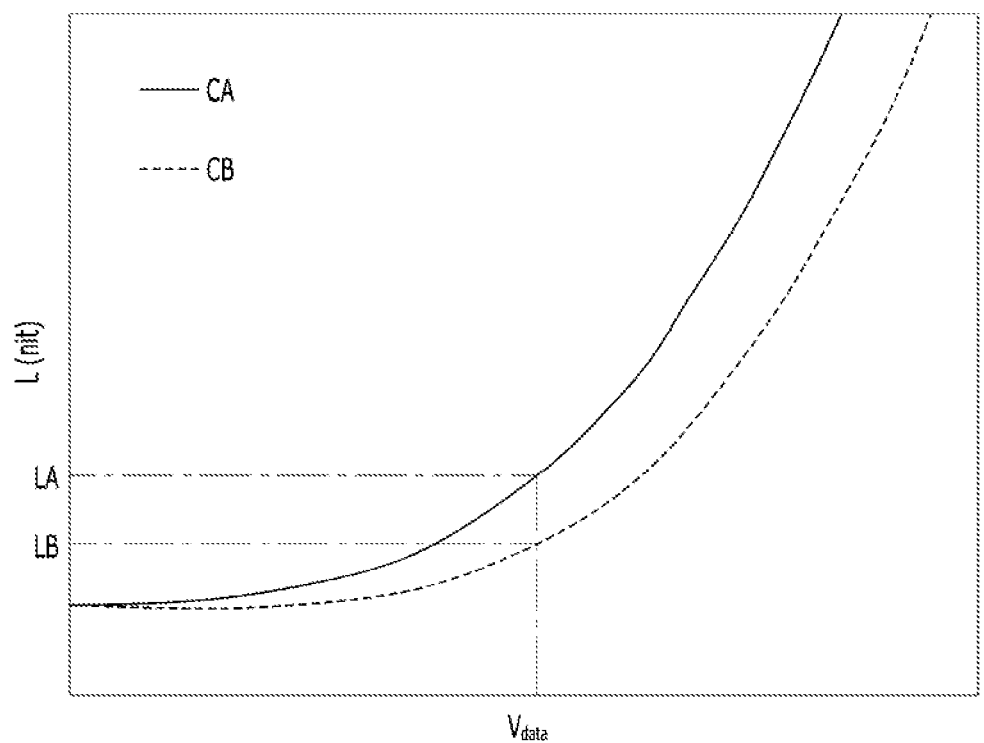
FIG. 6 is a graph showing changes in luminance depending on the capacitance values of storage capacitors arranged in the display panel shown in FIG. 1.

Concretely, even if the same data voltage Vdata is supplied to the data lines 178 of the subpixels having the same aperture ratio, the subpixels implement high luminance LA as the capacitance value CA of the capacitors is increased, and implement low luminance LB as the capacitance value CB of the capacitors is decreased, as shown in FIG. 6.

In this case, when the capacitance value of the capacitors of the first subpixels P1 having a relatively high aperture ratio and thus implementing low luminance is increased, luminance may be increased, and when the capacitance value of the capacitors of the second subpixels P2 having a relatively low aperture ratio and thus implementing high luminance is decreased, luminance may be decreased. Thereby, the first unit pixels PU1 including the first subpixels P1 having the high aperture ratio and the second unit pixels PU2 including the second subpixels P2 having the low aperture ratio may implement the same luminance.

Now, a method for adjusting the capacitance values of the capacitors will be described with reference to FIGS. 7 to 9.

Figure 7:
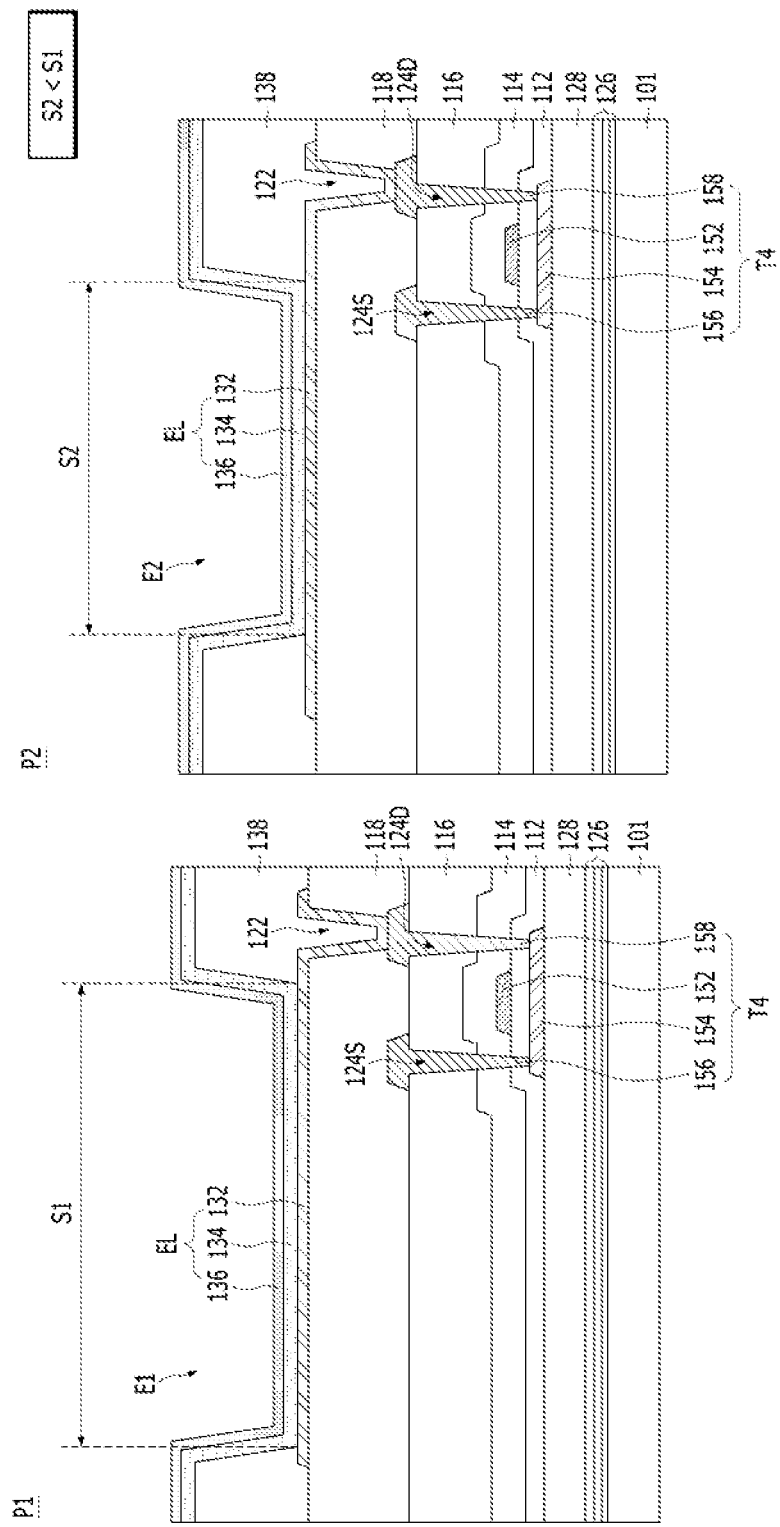
FIG. 7 is a cross-sectional view illustrating light emitting elements of first and second subpixels shown in FIG. 2.

Each of the first subpixel P1 and the second subpixel P2 shown in FIG. 7 includes the light emitting element EL and the fourth switch TFT T4 connected to the light emitting element EL.

The fourth switch TFT T4 includes a gate electrode 152, an active layer 154, a source electrode 156, and a drain electrode 158.

The active layer 154 is formed on an active buffer layer 128 so as to overlap the gate electrode 152, thus forming a channel between the source and drain electrodes 156 and 158.

The gate electrode 152 overlaps the channel region of the active layer 154 with a gate insulating film interposed therebetween. The gate electrode 152 may have a mono-layered structure or a multi-layered structure formed of one of molybdenum (Mo), aluminum (Al), chrome (Cr), gold (Au), titanium (T1), nickel (Ni), neodymium (Nd), copper (Cu) and alloys thereof, without being limited thereto.

The source and drain electrodes 156 and 158 are arranged on a second interlayer insulating film 116. The source and drain electrodes 156 and 158 are conductively connected to the active layer 154 exposed through source and drain contact holes 124S and 124D passing through a gate insulating film 112, a first interlayer insulating film 114 and the second interlayer insulating film 116. The source and drain electrodes 156 and 158 may have a mono-layered structure or a multi-layered structure formed of one of molybdenum (Mo), aluminum (Al), chrome (Cr), gold (Au), titanium (T1), nickel (Ni), neodymium (Nd), copper (Cu) and alloys thereof, without being limited thereto.

The light emitting diode EL includes an anode 132, at least one light emitting stack 134 formed on the anode 132, and a cathode 136 formed on the at least one light emitting stack 134.

The anode 132 is conductively connected to the drain electrode 158 of the fourth switch TFT T4 exposed through a pixel contact hole 122 passing through a planarization layer 118. A protective film (not shown) formed of an inorganic insulating material may be further arranged between the planarization layer 118 and the drain electrode 158.

The anode 132 is independently arranged on the planarization layer 118 in each of the subpixels. The anode 132 is arranged so as to overlap not only the emission area defined by a bank 138 but also the first switch TFT T4, and thereby, the emission area is increased. The bank 138 is formed to have emission holes E1 and E2 to expose the anodes 132, thereby defining the emission areas. The bank 138 is formed of an opaque material (for example, a black material) in the active area so as to prevent optical coherence between adjacent pixels. The bank 138 includes a shading material formed of at least one of a color pigment, an organic black material, or carbon.

The cathode 136 is formed to be opposite the anode 132 across the light emitting stack 134.

The subpixels P1 and P2, each of which has the above light emitting diode EL, have different aperture ratios depending on the positions of the subpixels P1 and P2. That is, the first subpixels P1 which are relatively far away from the boundary area BL form the bank 138 having the emission holes E1 having a first size S1, and the second subpixels P2 which are relatively close to the boundary area BL form the bank 138 having the emission holes E2 having a second size D2 smaller than the first size S1, as shown in FIG. 7. Here, the size S1 or S2 means at least one of a width, a length or an area. Thereby, the aperture ratio of the second subpixels P2 is set to be lower than the aperture ratio of the first subpixels P1.

Figure 8:
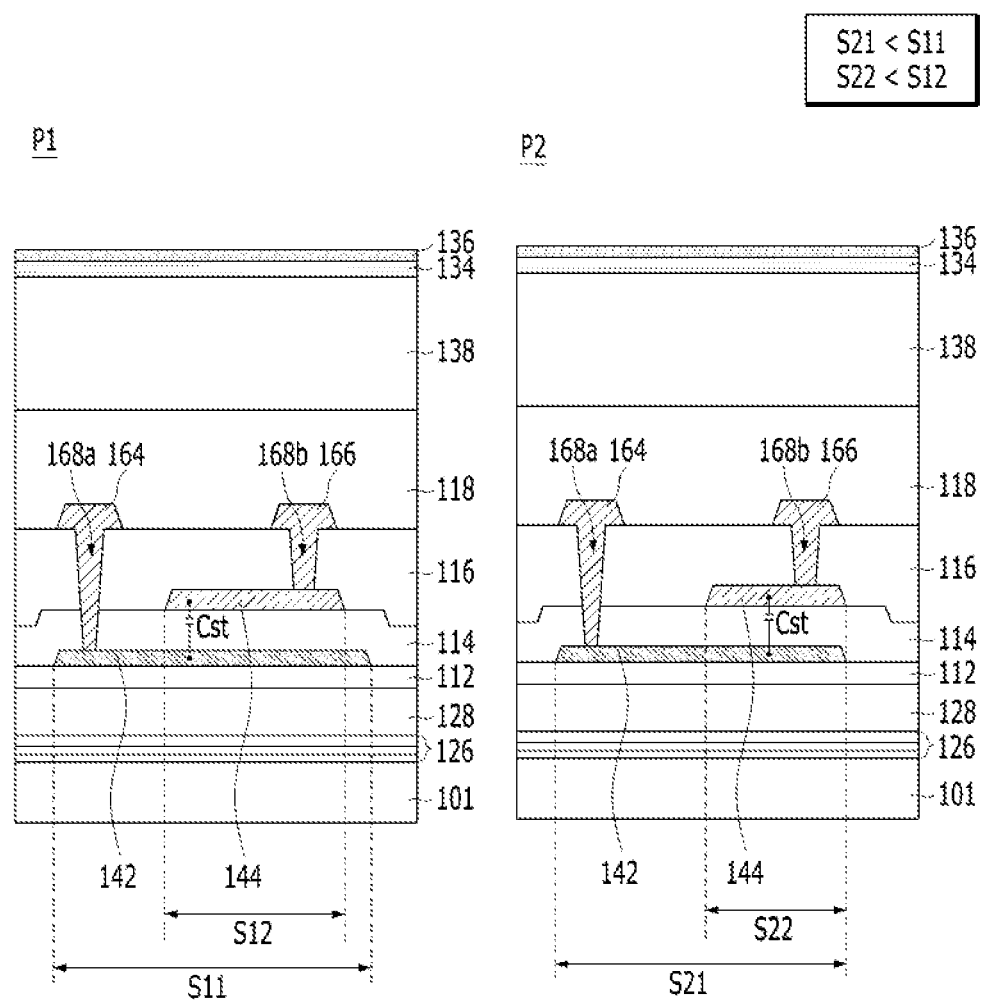
FIG. 8 is a cross-sectional view illustrating storage capacitors of the first and second subpixels shown in FIG. 2.

Here, the capacitance value of at least one of the storage capacitor Cst or the auxiliary capacitor Cgv of the second subpixel P2 is set to be smaller than the capacitance value of at least one of the storage capacitor Cst or the auxiliary capacitor Cgv of the first subpixel P1, as shown in FIGS. 7 and 8.

That is, each of the storage capacitors Cst of the first and second subpixels P1 and P2 includes first and second storage electrodes 142 and 144 which overlap each other with the first interlayer insulating film 114 interposed therebetween, as shown in FIG. 8. The first storage electrode 142 is formed through the same mask process as the gate electrode 152, and is thus formed of the same material as the gate electrode 152 on a gate insulating film 112. The first storage electrode 142 is exposed through a first storage contact hole 168a passing through the first and second interlayer insulating films 114 and 116, and is connected to a first storage connection electrode 164. The first storage connection electrode 164 is conductively connected to the gate electrode of the driving TFT DT. The second storage electrode 144 overlaps the first storage electrode 142 with the first interlayer insulating film 114 interposed therebetween, thus forming the storage capacitor Cst. The second storage electrode 144 is exposed through a second storage contact hole 168b passing through the second interlayer insulating film 116, and is connected to a second storage connection electrode 166. The second storage connection electrode 166 is conductively connected to a drain electrode of the first switch TFT T1.

The size S21 or S22 of at least one of the first or second storage electrode 142 or 144 included in the second subpixel P2 is smaller than the size S11 or S12 of at least one of the first or second storage electrode 142 or 144 included in the first subpixel P1. Thereby, the capacitance value of the storage capacitor Cst of the second subpixel P2 having a low aperture ratio may be set to be smaller than the capacitance value of the storage capacitor Cst of the first subpixel P1 having a high aperture ratio. As a result, the first subpixels P1 having the high aperture ratio which are relatively far away from the boundary area BL and the second subpixels P2 having the low aperture ratio which are relatively close to the boundary area BL may implement the same luminance.

Figure 9:
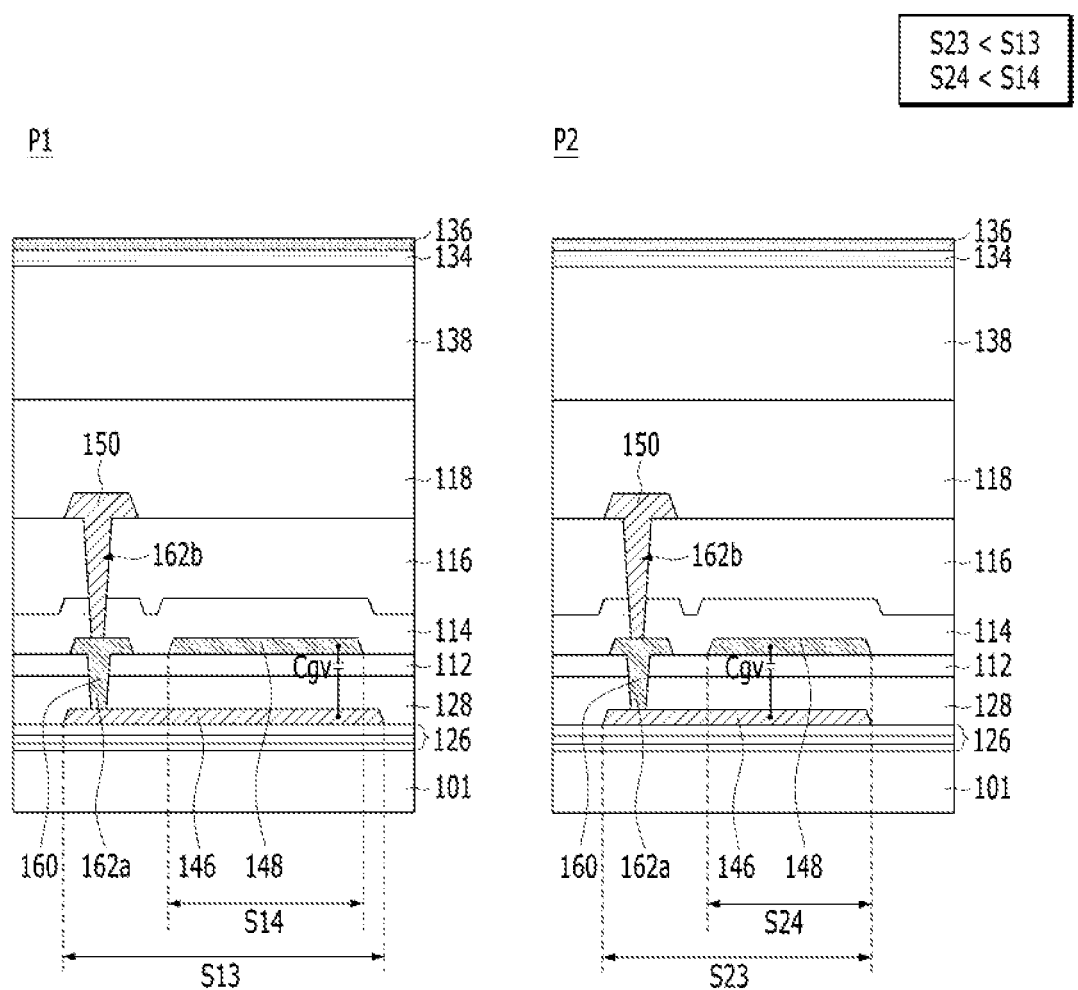
FIG. 9 is a cross-sectional view illustrating auxiliary capacitors of the first and second subpixels shown in FIG. 2.

Further, each of the auxiliary capacitors Cgv of the first and second subpixels P1 and P2 shown in FIG. 9 includes first and second auxiliary electrodes 146 and 148 which overlap each other, with the active buffer layer 128 and the gate insulating film 112 interposed therebetween. The first auxiliary electrode 146 is formed on a multi-buffer layer 126. The first auxiliary electrode 146 is exposed through a first auxiliary contact hole 162a passing through the active buffer layer 128 and the gate insulating film 112, and is connected to an auxiliary connection electrode 160. The auxiliary connection electrode 160 may be connected to a shield layer (not shown) which contacts an active layer of the driving TFT DT. The shield layer serves to prevent a decrease in the amount of current in the active layer of the driving TFT DT due to the flow of charges in a substrate 101 formed of polyimide (PI).

The auxiliary connection electrode 160 is exposed through a second auxiliary contact hole 162b passing through the first and second interlayer insulating films 114 and 116, and is connected to the high voltage (VDD) supply line 150. The second auxiliary electrode 148 overlaps the first auxiliary electrode 146 with the active buffer layer 128 and the gate insulating film 112 interposed therebetween, thus forming the auxiliary capacitor Cgv. The second auxiliary electrode 148 is formed coplanar with the first storage electrode 142 so as to be integrated with the first storage electrode 142.

The size S23 or S24 of at least one of the first or second auxiliary electrode 146 or 148 of the second subpixel P2 is smaller than the size S13 or S14 of at least one of the first or second auxiliary electrode 146 or 148 of the first subpixel P1. Thereby, the capacitance value of the auxiliary capacitor Cgv of the second subpixel P2 having the low aperture ratio may be set to be smaller than the capacitance value of the auxiliary capacitor Cgv of the first subpixel P1 having the high aperture ratio. As a result, the first subpixels P1 having the high aperture ratio which are relatively far away from the boundary area BL and the second subpixels P2 having the low aperture ratio which are relatively close to the boundary area BL may implement the same luminance.

Although this aspect of the present disclosure exemplarily illustrates that the capacitance values of the capacitors are adjusted using the sizes of the first and second storage electrodes 142 and 144 and the sizes of the first and second auxiliary electrodes 146 and 148, the capacitance values of the capacitors may be adjusted using a distance between the first and second storage electrodes 142 and 144 and a distance between the first and second auxiliary electrodes 146 and 148. That is, the distance between the first and second storage electrodes 142 and 144 included in the second subpixel P2 may be set to be greater than the distance between the first and second storage electrodes 142 and 144 included in the first subpixel P1. Alternatively, the distance between the first and second auxiliary electrodes 146 and 148 of the second subpixel P2 may be set to be greater than the distance between the first and second auxiliary electrodes 146 and 148 of the first subpixel P1.

Figure 10:
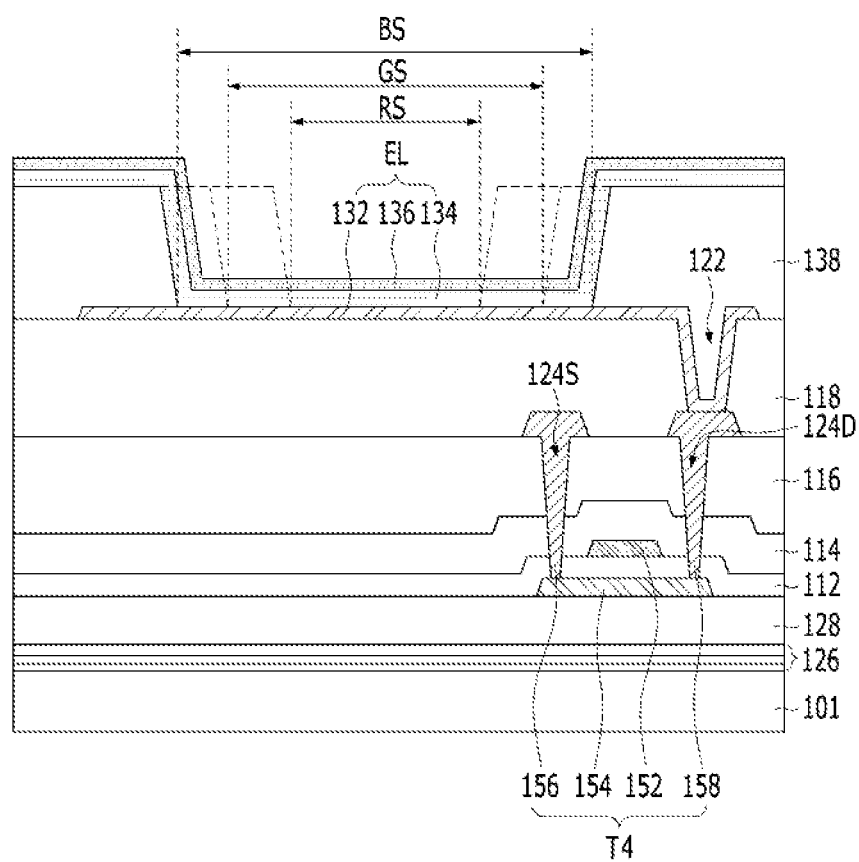
FIG. 10 is a cross-sectional view illustrating light emitting elements of first and second subpixels according to another aspect of the present disclosure.

FIG. 10 is a cross-sectional view illustrating a display device according to another aspect of the present disclosure.

The display device shown in FIG. 10 includes the same elements as those of the display device according to the former aspect of the present disclosure except that the capacitance values of capacitors of red, green and blue subpixels are adjusted so as to be proportional to the aperture ratios of the red, green and blue subpixels. Therefore, a detailed description of the elements of the display device according to this aspect that are the same as those of the display device according to the former aspect will be omitted.

As shown in FIG. 10, emission areas of red, green and blue subpixels R, G and B included in at least one of the first or second unit pixels PU1 or PU2 are different. That is, the blue subpixel B has an emission area having a first size BS, the green subpixel G has an emission area having a second size GS smaller than the first size BS, and the red subpixel R has an emission area having a third size RS smaller than the second size GS. That is, the blue subpixel B has a high aperture ratio, the green subpixel G has a medium aperture ratio, and the red subpixel R has a low aperture ratio. In this case, the capacitance values of capacitors Cst and Cgv of the green subpixel G are set to be smaller than the capacitance values of capacitors Cst and Cgv of the blue subpixel B and to be greater than the capacitance values of capacitors Cst and Cgv of the red subpixel R. Thereby, luminance deviations among the red, green and blue subpixels R, G and B due to aperture ratio differences thereamong may be prevented.

Figure 11A:
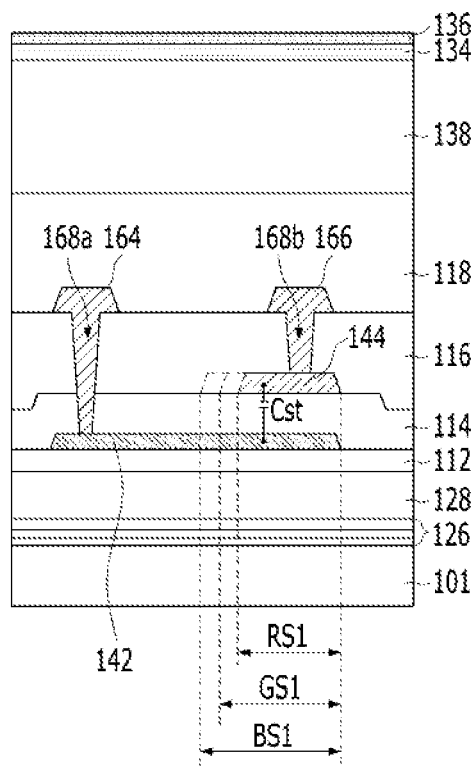
FIG. 11A is a cross-sectional view illustrating a storage capacitor of a subpixel shown in FIG. 10.
Figure 11B:
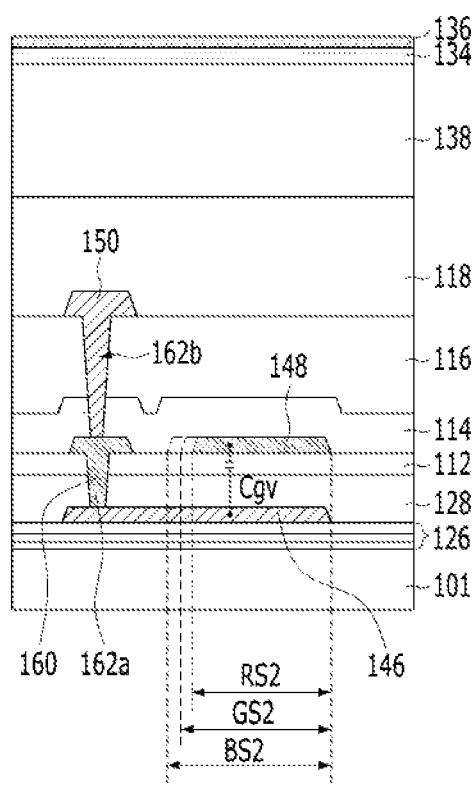
FIG. 11B is a cross-sectional view illustrating an auxiliary capacitor of the sub-pixel shown in FIG. 10.

In order to set different capacitance values of capacitors Cst and Cgv of the red, green and blue subpixels R, G and B having different aperture ratios, the capacitance value of the storage capacitor Cst and the capacitance value of the auxiliary capacitor Cgv are adjusted, as shown in FIGS. 11A and 11B.

As shown in FIG. 11A, the size GS1 of at least one of a first or second storage electrode 142 or 144 forming the storage capacitor Cst of the green subpixel G is set to be greater than the size RS1 of at least one of a first or second storage electrode 142 or 144 forming the storage capacitor Cst of the red subpixel R and to be smaller than the size BS1 of at least one of a first or second storage electrode 142 or 144 forming the storage capacitor Cst of the blue subpixel B.

As shown in FIG. 11B, the size GS2 of at least one of a first or second storage electrode 146 or 148 forming the auxiliary capacitor Cgv of the green subpixel G is set to be greater than the size RS2 of at least one of a first or second auxiliary electrode 146 or 148 forming the auxiliary capacitor Cgv of the red subpixel R and to be smaller than the size BS2 of at least one of a first or second auxiliary electrode 146 or 148 forming the auxiliary capacitor Cgv of the blue subpixel B.

Thereby, the capacitance value of at least one of the storage capacitor Cst or the auxiliary capacitor Cgv of the red subpixel R having the low aperture ratio may be set to be smaller than the capacitance value of at least one of the storage capacitor Cst or the auxiliary capacitor Cgv of the blue subpixel B having the high aperture ratio. As a result, the red, green and blue subpixels R, G and B having different aperture ratios may implement the same luminance.

As such, in the present disclosure, the second subpixels P2 having an aperture ratio smaller than that of the first subpixels P1 arranged in the active area AA are arranged in the boundary area BL between the bezel area and the active area. Thereby, the boundary area is expressed as a soft curved line or an oblique line, and thus abnormal visibility of a stepped shape may be eliminated.

Further, in the present disclosure, by setting the capacitance values of the capacitors of the first and second subpixels to be proportional to the aperture ratios of the first and second subpixels, the first and second subpixels may implement the same luminance, thus being capable of preventing luminance deviation between the first and second subpixels.

As apparent from the above description, in a display device according to one aspect of the present disclosure, second subpixels having an aperture ratio smaller than that of first subpixels arranged in an active area are arranged in a boundary area (also referred to as a boundary line or a dead zone) between the active area and a bezel area. Thereby, the boundary area is expressed as a soft curved line or an oblique line, and thus abnormal visibility of a stepped shape may be eliminated.

Further, in the display device according to the aspect of the present disclosure, by setting the capacitance values of capacitors of the first and second subpixels to be proportional to the aperture ratios of the first and second subpixels, the first and second subpixels may implement the same luminance, thus being capable of preventing luminance deviation between the first and second subpixels.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A display device comprising:
  a substrate having an active area and a non-active area;
  a plurality of first subpixels arranged in the active area; and
  a plurality of second subpixels arranged in the active area in close proximity to a boundary area between the active area and the non-active area, wherein the second subpixels are disposed closer to the boundary area than the first subpixels,
  wherein the first subpixels have a rectangular shape emission area in a plan view and the subpixels have a non-rectangular shape emission area in a plan view, and
  wherein each of the first subpixels includes a first storage capacitor with a first capacitance, each of the second subpixels includes a second storage capacitor with a second capacitance, and the first capacitance and the second capacitance are related based on a proportion associated with the rectangular shape emission area and the non-rectangular shape emission area.

2. The display device according to claim 1, wherein the second subpixels have a second aperture ratio different from a first aperture ratio of the first subpixels; and
  wherein the first capacitance value and the second capacitance value are proportional to the first and second aperture ratios.

3. The display device according to claim 2, wherein the second aperture ratio of the second subpixels is lower than the first aperture ratio of the first subpixels.

4. The display device according to claim 3, wherein the second aperture ratio of the second subpixels is gradually decreased as the subpixels are closer to the boundary area.

5. The display device according to claim 1, wherein each of the first and second subpixels comprises:
  a light emitting diode connected to a corresponding one of the first and second storage capacitors; and
  a bank having an emission hole configured to expose an anode of the light emitting diode.

6. The display device according to claim 5, wherein a size of the emission holes in the second subpixels is smaller than a size of the emission holes in the first subpixels.

7. The display device according to claim 1, wherein each of the first and second storage capacitors comprises first and second storage electrodes arranged on the substrate to overlap with each other,
  wherein a size of at least one of the first or second storage electrode of the second storage capacitors of the second subpixels is smaller than a size of at least one of the first or second storage electrode of the first storage capacitors of the first subpixels.

8. The display device according to claim 1, wherein each of the first and second storage capacitors comprises first and second storage electrodes arranged on the substrate to overlap with each other,
  wherein a distance between the first and second storage electrodes of the second storage capacitors of the second subpixels is greater than a distance between the first and second storage electrodes of the first storage capacitors of the first subpixels.

9. The display device according to claim 1, wherein each of the first and second subpixels comprises an auxiliary capacitor connected to a corresponding one of the first and second storage capacitors,
  wherein a capacitance value of the auxiliary capacitors of the second subpixels is smaller than a capacitance value of the auxiliary capacitors of the first pixels.

10. The display device according to claim 9, wherein each of the auxiliary capacitors comprises first and second auxiliary electrodes arranged on the substrate so as to overlap with each other, and
  wherein a size of at least one of the first or second auxiliary electrode of the auxiliary capacitors of the second subpixels is smaller than a size of at least one of the first or second auxiliary electrode of the auxiliary capacitors of the first subpixels.

11. The display device according to claim 9, wherein each of the auxiliary capacitors comprises first and second auxiliary electrodes arranged on the substrate so as to overlap with each other, and
wherein a distance between the first and second auxiliary electrodes of the auxiliary capacitors of the second subpixels is greater than a distance between the first and second auxiliary electrodes of the auxiliary capacitors of the first subpixels.

12. The display device according to claim 1, wherein the active area has a non-rectangular shape.

13. A display device comprising:
a substrate having an active area and a non-active area, and the active area having a non-rectangular shape;
a plurality of first unit pixels arranged in the active area; and
a plurality of second unit pixels arranged in the active area in close proximity to a boundary area between the active area and the non-active area, wherein the second unit pixels are disposed closer to the boundary area than the first unit pixels,
wherein the first unit pixels have a rectangular shape emission area in a plan view and the second unit pixels have a non-rectangular shape emission area in a plan view, and
wherein each of the first unit pixels include a first storage capacitor with a first capacitance, each of the second unit pixels include a second storage capacitor with a second capacitance, and the first capacitance and the second capacitance are related based on a proportion associated with the rectangular shape emission area and the non-rectangular shape emission area.

14. The display device according to claim 13, wherein the second unit pixels has a second aperture ratio lower than a first aperture ratio of the first unit pixels; and
wherein the first capacitance value and the second capacitance value are proportional to the first and second aperture ratios.

15. The display device according to claim 14, wherein each subpixel of the first and second unit pixels comprises an auxiliary capacitor connected to a corresponding one of the first and second storage capacitors,
wherein a capacitance value of each of the auxiliary capacitors of the subpixels of the second unit pixels is smaller than a capacitance value of each of the auxiliary capacitors of the subpixels of the first unit pixels.

16. The display device according to claim 13, wherein each of the first and second unit pixels comprises red, green and blue subpixels,
wherein the first unit pixels have a different aperture ratio than the second unit pixels, and
wherein capacitance values of storage capacitors of the red, green and blue subpixels are proportional to the different aperture ratios of the red, green and blue subpixels.

17. The display device according to claim 13, wherein each first and second subpixels of the first and second unit pixels comprises:
a light emitting diode connected to a corresponding one of the first and second storage capacitors; and
a bank having an emission hole configured to expose an anode of the light emitting diode.

18. The display device according to claim 17, wherein a size of the emission holes in the second subpixels of the second unit pixels in a cross-sectional view is smaller than a size of the emission holes in the first subpixels of the first unit pixels in a cross-sectional view.

* * * * *